(12) United States Patent
Kosugi et al.

(10) Patent No.: US 9,779,970 B2
(45) Date of Patent: Oct. 3, 2017

(54) HEATER SUPPORTING DEVICE

(75) Inventors: Tetsuya Kosugi, Toyama (JP); Hitoshi Murata, Toyama (JP); Shinobu Sugiura, Toyama (JP); Masaaki Ueno, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 670 days.

(21) Appl. No.: 13/101,625

(22) Filed: May 5, 2011

(65) Prior Publication Data

US 2011/0281226 A1      Nov. 17, 2011

(30) Foreign Application Priority Data

May 11, 2010   (JP) .................................. 2010-108968
Mar. 17, 2011   (JP) .................................. 2011-058673

(51) Int. Cl.
*H01L 21/22*      (2006.01)
*H01L 21/67*      (2006.01)

(52) U.S. Cl.
CPC .............................. *H01L 21/67109* (2013.01)

(58) Field of Classification Search
USPC ............ 432/225; 248/68.1, 73, 74.4; 165/78
See application file for complete search history.

(56) References Cited

U.S. PATENT DOCUMENTS

| | | | | |
|---|---|---|---|---|
| 3,846,619 A | * | 11/1974 | Wightman et al. | 219/532 |
| 5,187,771 A | * | 2/1993 | Uchida | 392/416 |
| 5,578,232 A | * | 11/1996 | Engelke | 219/532 |
| 6,596,974 B2 | * | 7/2003 | Howard et al. | 219/536 |
| 2007/0169701 A1 | | 7/2007 | Reynolds et al. | |
| 2009/0194521 A1 | * | 8/2009 | Kobayashi et al. | 219/520 |

FOREIGN PATENT DOCUMENTS

| | | |
|---|---|---|
| JP | 1-010921 U | 3/1989 |
| JP | 11-067424 A | 3/1999 |
| JP | 2006-216566 A | 8/2006 |
| JP | 2009-180462 A | 8/2009 |
| TW | 200736567 A | 1/2007 |

* cited by examiner

*Primary Examiner* — Alissa Tompkins
*Assistant Examiner* — John Bargero
(74) *Attorney, Agent, or Firm* — Volpe and Koenig, P.C.

(57) ABSTRACT

A heater supporting device for use in a semiconductor manufacturing apparatus is provided so as to improve the uniformity of a temperature property and the expected lifespan by preventing support pieces from being damaged and separated from piece holders, and preventing deterioration in adiabatic efficiency in the vicinity of a ceiling of a vertical type furnace. A heating element of a coil shape is disposed around an object. The support pieces are vertically connected in multiple. Hollows of an elliptical shape are formed between the respective support pieces. Concave insertions are formed on one of upper and lower surfaces of the respective support pieces, and convex insertions are formed on the other one of the upper and lower surfaces of the respective support pieces. The convex insertions are insert-fitted with the concave insertions. The support pieces are vertically connected in multiple by insert-fitting the concave insertions to the convex insertions.

15 Claims, 13 Drawing Sheets

PRIOR ART

PRIOR ART

PRIOR ART

PRIOR ART

HEATER SUPPORTING DEVICE

CROSS-REFERENCE TO RELATED APPLICATIONS

This application is based upon and claims the benefit of Japanese Patent Application No. 2010-108968, filed on May 11, 2010, and Japanese Patent Application No. 2011-58673, filed on Mar. 17, 2011, the entire contents of which are hereby incorporated by reference.

TECHNICAL FIELD

Embodiments described herein relate to a heater supporting device used in a semiconductor manufacturing apparatus, and more particularly, in a vertical type furnace employed in a semiconductor manufacturing apparatus.

BACKGROUND

A vertical type furnace may be employed to perform a semiconductor manufacturing process such as a diffusion process and a chemical vapor deposition (CVD) process.

The vertical type furnace heats up an interior thereof and supplies a reaction gas thereto, to thereby form a thin film on a surface of a substrate to be processed such as a wafer or the like. The vertical type furnace is provided with a heater for this purpose.

With reference to FIG. 8, a vertical type furnace having a conventional heater for use in a semiconductor manufacturing apparatus will be described.

A vertical type furnace 1 is provided with a cylindrical type heater 2. A uniform heating tube 3 and a reaction tube 4 are concentrically disposed in an interior of the heater 2. A boat 5 is inserted into and disposed in the reaction tube 4. The boat 5 is placed over an elevator cap 7 through a boat cap 6. The elevator cap 7 is configured to be movable upward and downward by a boat elevator (not shown).

A gas introduction conduit 8 is inserted into and communicated with an upper portion of the reaction tube 4. An exhaust port 9 is disposed on a lower portion of the reaction tube 4. A lower portion of the gas introduction conduit 8 is connected to a gas supply conduit 10. The exhaust port 9 is connected to an exhaust conduit 11.

The boat 5 may be discharged from the reaction tube 4 and a predetermined number of sheets of wafers 12 may be loaded on the boat 5. Thereafter, the boat 5 loading the wafers 12 thereon may be moved upward by the boat elevator (not shown) to be inserted into and disposed in the reaction tube 4. The heater 2 then may heat up an interior of the reaction tube 4 to a predetermined temperature. A reaction gas may be introduced into the reaction tube 4 through the gas supply conduit 10 and the gas introduction conduit 8. As a result, a thin film may be formed on a surface of the respective wafers 12. The reaction gas remaining after the thin film formation may be exhausted through the exhaust port 9 and the exhaust conduit 11.

Hereinafter, with reference to FIG. 9, FIG. 10A and FIG. 10B, the conventional heater 2 will be described in detail.

FIG. 9 is a schematic vertical cross-section view of the conventional heater 2. The heater 2 includes a coil type heating element 13 configured to enclose the surroundings of the uniform heating tube 3 (not shown in FIG. 9), support pieces 14 configured to support the heating element 13, a piece holder 15 configured to hold the support pieces 14, a periphery heat insulator 16 provided to be wound around the piece holder 15, and a ceiling heat insulator 17 configured to seal a ceiling portion of the periphery heat insulator 16. The periphery heat insulator 16 and the ceiling heat insulator 17 are enclosed with a heater case (not shown). The heating element 13 has a circular cross-section and is supported at positions, which are equally spaced by the support pieces 14 on a circumference of the heater 2.

The support pieces 14 may be made of high alumina material. A multiple number of the support pieces 14 may be vertically connected to each other. FIG. 10A and FIG. 10B are a plan view and a front view of the support piece, respectively. On an upper surface of each of the support pieces 14, protrusions 18 and 19 are formed to diagonally extend in an upper outer direction. An upward-facing curved concave surface 21 of a semicircular cross-section is formed to connect the protrusions 18 and 19 to each other. Also, on a lower surface of each of the support pieces 14, a concave portion 22 is fainted to have a concave insertion 23 having a reverse-trapezoid cross-section and a downward-facing concave curved surface 24 having a semicircular cross-section, which is consecutively coupled to the concave insertion 23. The concave insertion 23 of one support piece is configured so that the protrusions 18 and 19 of another support piece can be insert-fitted thereto (or engaged therewith). By insert-fitting the protrusions 18 and 19 to the concave insertion 23, a hollow is formed by a combination of the upward-facing curved concave surface 21 and the downward-facing curved concave surface 24, such that the heating element 13 may be inserted into the hollow.

FIG. 11A and FIG. 11B show a plan view and a front view of another example of the conventional support piece, respectively.

A convex insertion 26 having a reverse-trapezoid cross-section is formed on an upper left side of a support piece 25. Both lateral ends of the convex insertion 26 are diagonally extended from the upper side of the support piece 25 in an upper outer direction. Also, on a right side from the convex insertion 26, an upward-facing curved concave surface 27 having a semi-elliptical cross-section is formed. Further, on a lower left side of the support piece 25, a concave insertion 28 having a reverse-trapezoid cross-section is formed. The concave insertion 28 of one support piece is configured so that the convex insertion 26 of another support piece may be insert-fitted thereto. By insert-fitting the convex insertion 26 to the concave insertion 28, a hollow is formed by a combination of the upward-facing curved concave surface 27 and a lower surface of the support piece 25, such that the heating element 13 may be inserted to the hollow.

In the conventional heater 2, an external force may be applied to the multiple-connected support pieces 14 or 25, e.g., due to vibration of the heating element 13 during transportation or thermal expansion/contraction of the heating element 13 during a film forming process performed on the wafer 12. In this case, the external force may be concentrated on one of the multiple-connected support pieces 14 or 25 in a radial or circumferential direction. Specifically, when using the support piece 14, stress (or external force) may be concentrated on an angled portion of the concave insertion 23 of the support piece 14 as shown in FIG. 12A. On the other hand, when using the support piece 25, stress may be concentrated on an angled portion of the concave insertion 28 of the support piece 25 as shown in FIG. 13A. That is, the stress may be concentrated on the vicinity of a portion where the support pieces 14 or 25 are connected to each other, and thus damage may occur at the connection portion of the support pieces 14 or 25. The damage of the support piece 14 or 25 may diminish the heating efficiency of the heater 2.

Further, if some fragments are separated and fall from the damaged support piece 14 or 25, this may cause the multiple-connected support pieces 14 or 25 to be unable to securely support the heating element 13. This in turn may cause a short circuit between different portions of the heating element 13 due to an electrical coupling thereof. Also, the heating element 13 may contact the uniform heat tube 3, which may cause an accident such as electric leakage. As a result, the expected lifespan of the heating element 13 may be reduced.

Further, in the conventional heater 2, as shown in FIG. 14, e.g., due to vibration generated during transport or due to thermal expansion/contraction of the heating element 13, the multiple-connected support pieces 14 or 25 and the piece holder 15 may be separated from the periphery heat insulator 16. Furthermore, the ceiling heat insulator 17 may be separated from the periphery heat insulator 16 due to a thermal expansion difference between the piece holder 15 and the periphery heat insulator 16. As a result, a gap may be formed between the ceiling heat insulator 17 and the periphery heat insulator 16, which causes heat leakage through the gap and deteriorates the adiabatic efficiency.

In order to overcome the above problems, a heater supporting device has been proposed for preventing support pieces from being misaligned or damaged due to thermal expansion/contraction of a heating element, by limiting relative displacements of the respective support pieces in radial and circumferential directions of a vertical type furnace, and also limiting the movement of a piece holder connected to the respective support pieces in a centric direction of the vertical type furnace (for example, See Japanese Laid-Open Patent Publication No. Hei-11-67424).

SUMMARY

The present disclosure in some embodiments provides a heater supporting device for use in a semiconductor manufacturing apparatus, which may prevent support pieces from being damaged and separated from piece holders and prevent a deterioration in adiabatic efficiency in the vicinity of a ceiling portion, thereby increasing the uniformity of temperature property and the expected lifespan.

According to the present disclosure, there is provided a heater supporting device comprising: a heating element having a coil shape and being disposed around an object to be heated; and support pieces being vertically connected in multiple, wherein hollows having an elliptical shape elongated in a radial direction are formed between the respective support pieces, the heating element is inserted into the hollows and supported by the respective support pieces, concave insertions are located, in a direction intersecting with the heating element, on upper surfaces of the respective support pieces and convex insertions are located on lower surfaces of the respective support pieces, the convex insertions of one of the support pieces being insert-fitted with the concave insertions of another one of the support pieces adjacent to the one of the support pieces, and the support pieces are vertically connected in multiple by insert-fitting the concave insertions to the convex insertions.

Also, according to the present disclosure, the heater supporting device further includes piece holders being vertically connected in multiple to support the support pieces and a periphery heat insulator disposed around the heating element to support the piece holders, wherein the piece holders control the movement of the support pieces in a horizontal direction.

Further, according to the present disclosure, in the heater supporting device, the respective piece holders have a U-shaped concave portion, a vertically elongated engagement groove and an engagement convex are formed on at least one of inner surfaces of the concave portion, the inner surfaces facing each other and at least one of lateral sides of the respective support pieces, such that the engagement groove faces the engagement convex, and the support pieces are insert-fitted to the piece holders by insert-fitting the engagement convex to the engagement groove.

DETAILED DESCRIPTION

Embodiments will now be described in detail with reference to the accompanying drawings.

With reference to FIG. 1 to FIG. 7, a heater 30 in accordance with one embodiment of the present disclosure will be described.

A coil-type heating element 31 is disposed concentrically with respect to a uniform heating tube (not shown) to be heated. The heating element 31 has a circular cross-section and is supported by support pieces 32 at positions, which are equally spaced on a circumference of the heater 30.

Figure 4A:
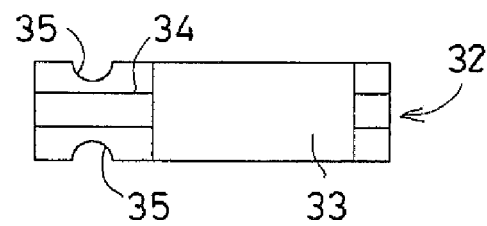
FIG. 4A, FIG. 4B and FIG. 4C are a plan view, a front view and a lateral view of a support piece in accordance with one embodiment of the present disclosure, respectively.
Figure 4B:
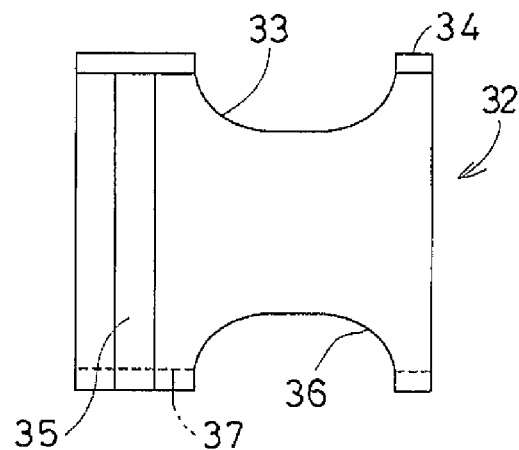
Figure 4C:
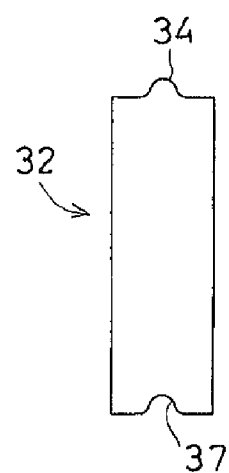

The support pieces 32 may be made of high alumina material. Further, a multiple number of the support pieces 32 may be vertically connected to each other. With reference to FIG. 4A to FIG. 4C, one example of the support pieces 32 will be described. The upper, lower, left and right sides in FIG. 4B refer to the corresponding portions of the support piece 32. Also, the right and left sides of FIG. 4B refer to a center-facing side of the heater 30 and an outward-facing side thereof, respectively. Further, a vertical direction of FIG. 4A refers to a thickness direction of the support piece 32.

On an upper surface of the support piece 32, an upward-facing curved concave surface 33 of a semi-elliptic cross-section is formed. Also, at a center section of the upper surface of the support piece 32 in the thickness direction thereof (except for the upward-facing curved concave surface 33), convex insertions 34 of a semicircular or substantially semicircular column shape are formed extending from one end of the upper surface in the center-facing side to the other end thereof in the outward-facing side in a horizontal direction, i.e., in a direction perpendicular to the heating element 31 (i.e., a direction perpendicular to a center axis of the upward-facing curved concave surface 33). Further, on front and rear surfaces of the support piece 32 in the outward-facing side thereof, engagement concaves 35 of a substantially semicircular column shape are formed to be extended in a vertical direction.

Meanwhile, on a lower surface of the support piece 32, a downward-facing curved concave surface 36 of a semi-elliptic cross-section is formed. Also, at a center section of the lower surface of the support piece 32 in the thickness direction thereof (except for the downward-facing curved concave surface 36), concave insertions 37 of a semicircular or substantially semicircular column shape are formed extending in a direction perpendicular to the heating element 31 (i.e., a direction perpendicular to a center axis of the downward-facing concave surface 36). With such configuration, the concave insertions 37 of one support piece 32 can be insert-fitted to convex insertions 34 of another support piece 32. In this way, the convex insertions 34 and the concave insertions 37 are coupled to each other to constitute an insert-fitting part (or engagement part) of each of the support pieces 32. Through the insert-fitting of the convex insertions 34 and the concave insertions 37, a plurality of the support pieces 32 can be vertically connected to each other. Also, when the multiple-connected support pieces 32 are fastened to the support piece holders 42 to be described below, the insert-fitting parts are radially disposed with respect to a center of a vertical type furnace (not shown).

Through the insert-fitting of the convex insertions 34 and the concave insertions 37, relative displacements between the respective support pieces 32 in vertical and circumferential directions of the vertical type furnace can be controlled. Also, through such insert-fitting structure, a hollow 38 is formed by the combination of the upward-facing curved concave surface 33 of one support piece 32 and the downward-facing concave curved surface 36 of another support piece 32. In this case, a cross-section of the hollow 38 has an elliptical shape elongated in a radial direction of the vertical type furnace. In the manner as described above, the support pieces 32 are vertically connected in multiple to form plural hollows 38 at positions equally spaced in a vertical direction.

Since the convex insertions 34 and the concave insertions 37 have a curved surface of a semicircular or substantially semicircular column shape, when the support pieces 32 are insert-fitted with each other, it is possible to tilt the respective support pieces 32 to a certain extent along the curved surface of the convex insertions 34 and the concave insertions 37. Therefore, it is possible to absorb external forces applied to the support pieces 32 in the circumferential direction of the vertical type furnace, and to disperse stresses applied to the insert-fitting parts of the support pieces 32.

Figure 15A:
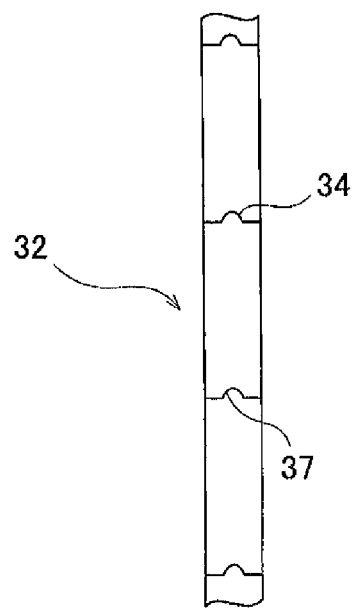
FIG. 15A is a lateral view of multiple-connected support pieces in a normal state in accordance with the present disclosure.
Figure 15B:
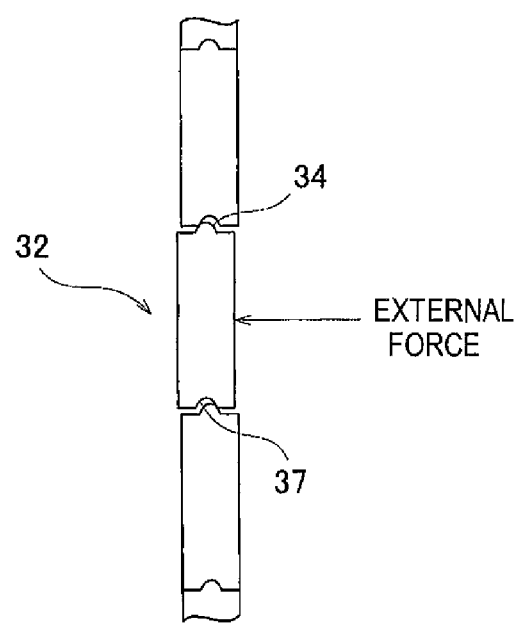
FIG. 15B is a lateral view of the multiple-connected support pieces in accordance with the present disclosure when an external force is applied in a circumferential direction.

FIG. 15A illustrates a lateral view of the multiple-connected support pieces 32 in a normal state. When external force applied to one of the multiple-connected support pieces 32 in a circumferential direction is so high that it may not be totally absorbed by a tilting of the support pieces 32 along the curved surfaces of convex insertions 34 and concave insertions 37, the concave insertion 37 of an upper support piece 32 may slide along the curved surface of the convex insertion 34 of a underlying support piece 32 (which is insert-fitted with the upper one). As a result, the curved surface of the convex insertion 34 of the underlying support piece 32 lifts up the concave insertion 37 of the upper support piece 32, as shown in FIG. 15B. In this way, the support pieces 32, to which the external force is being applied, are displaced relatively to each other in the circumferential direction. Also, the upper support piece 32 is displaced relatively to the underlying support piece 32 in an upward direction, such that stress applied to the insert-fitting parts of the support pieces 32 can be dispersed in the upward direction.

Furthermore, when the external force is not applied any longer to the support pieces 32 in the circumferential direction, the support pieces 32 are relatively displaced (or tilted) along the curved surfaces of the convex insertions 34 and the concave insertions 37 again in the opposite direction with respect to the external force due to its self weight. Consequently, the convex insertions 34 and the concave insertions 37 are re-engaged with each other, such that the support pieces 32 are restored to the normal state shown in FIG. 15A.

Figure 6:
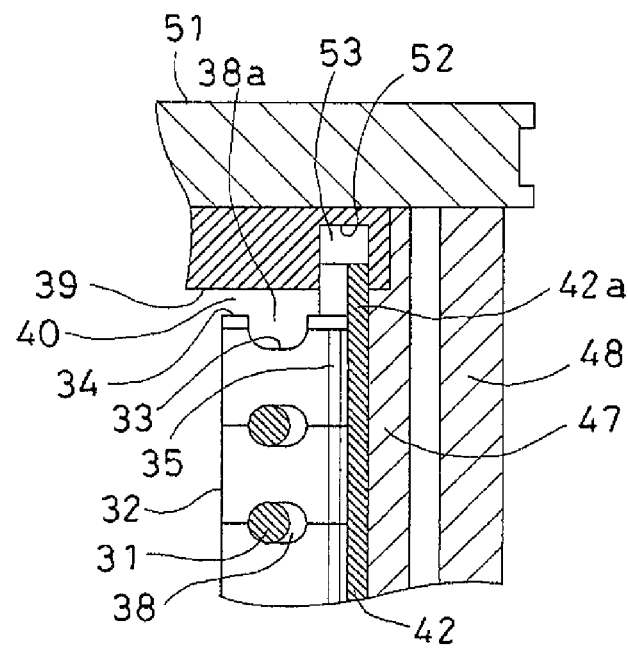
FIG. 6 is an enlarged view of a portion C of FIG. 1.
Figure 7:
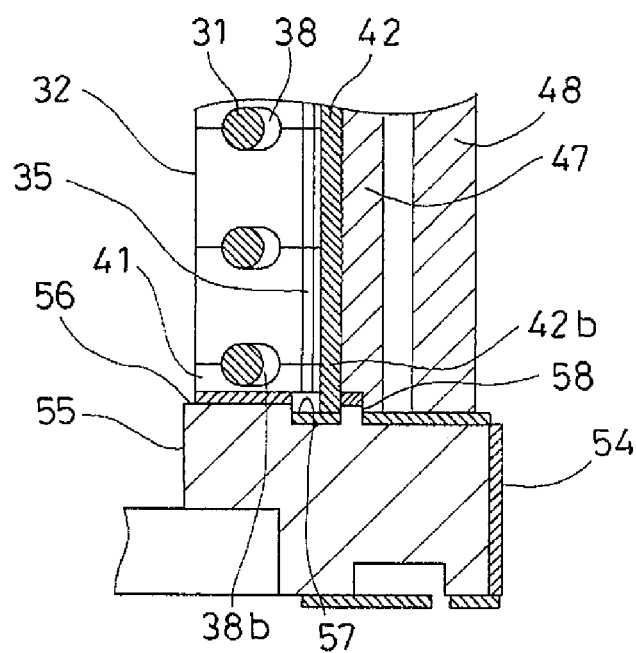
FIG. 7 is an enlarged view of a portion D of FIG. 1.
Figure 8:
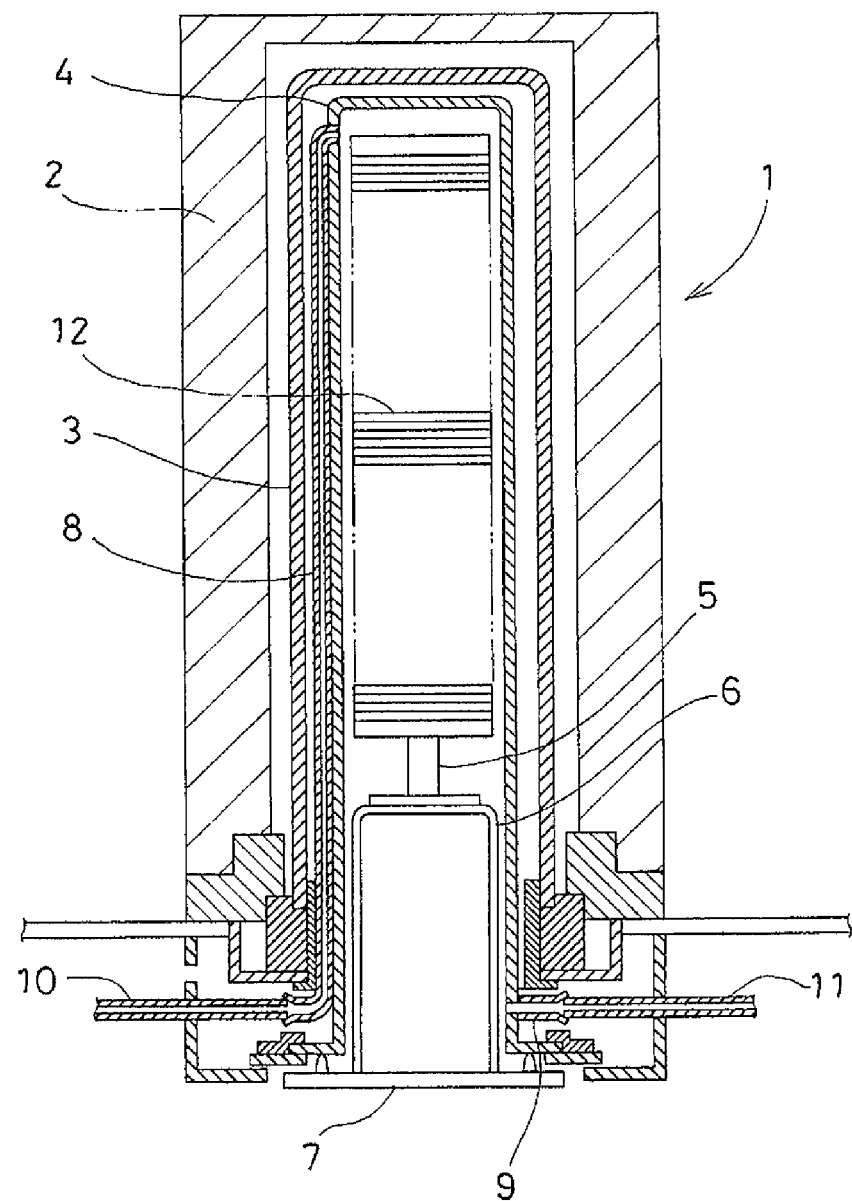
FIG. 8 is a vertical cross-section view of a conventional vertical-type furnace.
Figure 9:
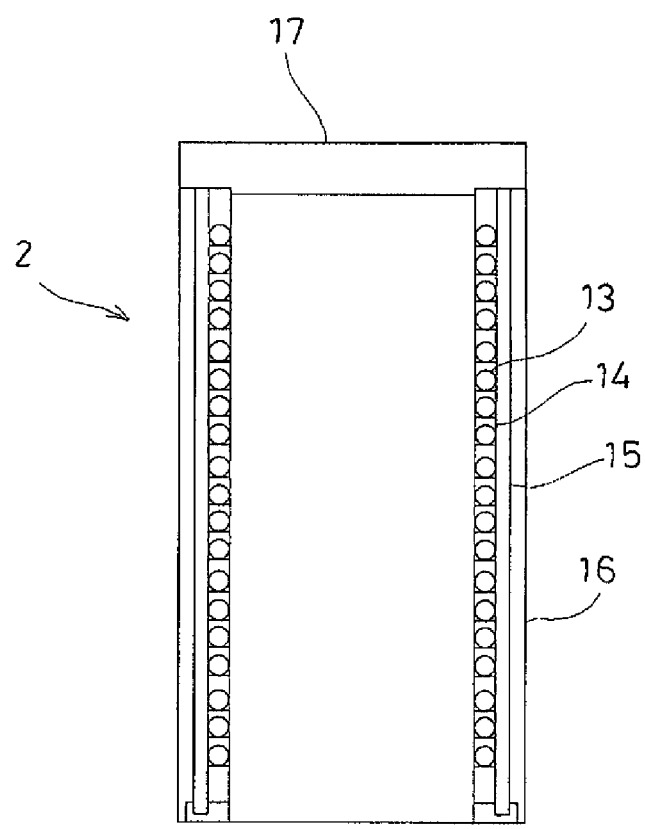
FIG. 9 is a schematic vertical cross-section view of a conventional heater.
Figure 10A:
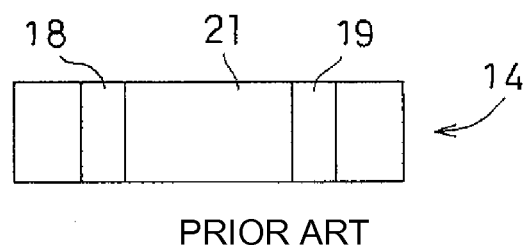
FIG. 10A and FIG. 10B are a plan view and a front view of a conventional support piece, respectively.
Figure 10B:
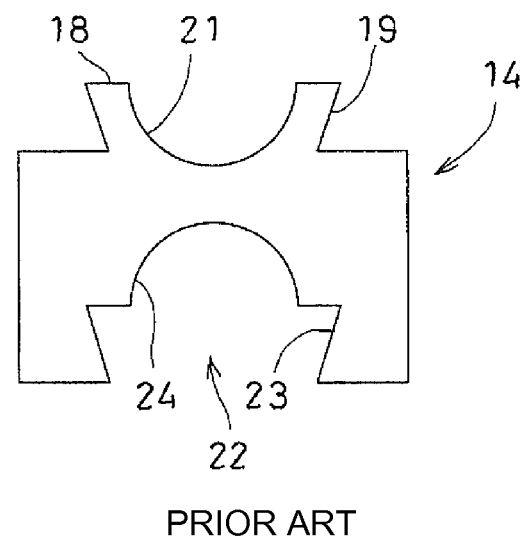
Figure 11A:
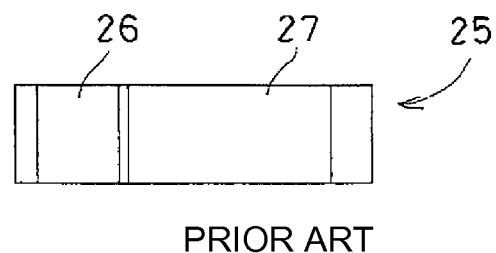
FIG. 11A and FIG. 11B are a plan view and a front view of another conventional support piece, respectively.
Figure 11B:
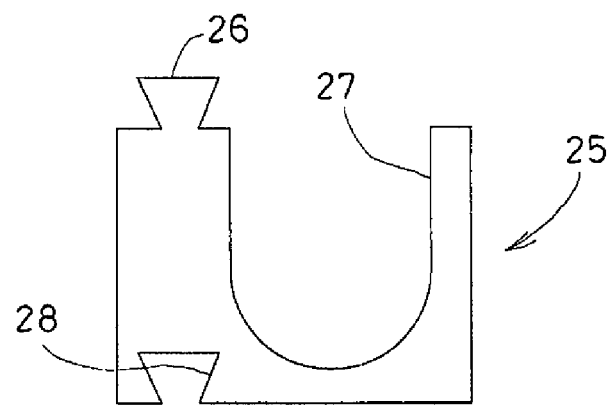
Figure 12A:
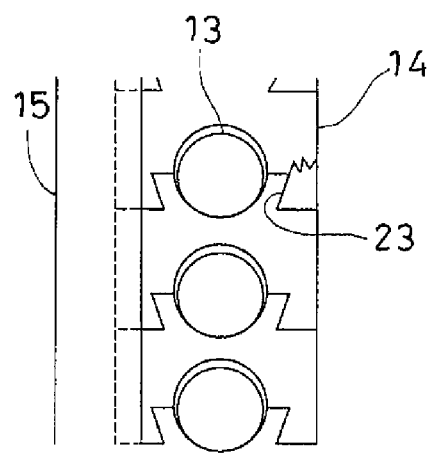
FIG. 12A and FIG. 12B are an enlarged front view and an enlarged lateral view of the principle parts of the conventional support piece being damaged, respectively.
Figure 12B:
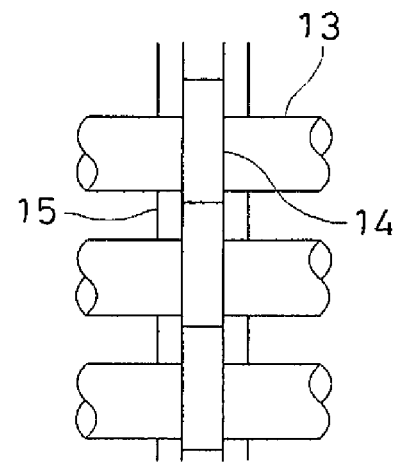
Figure 13A:
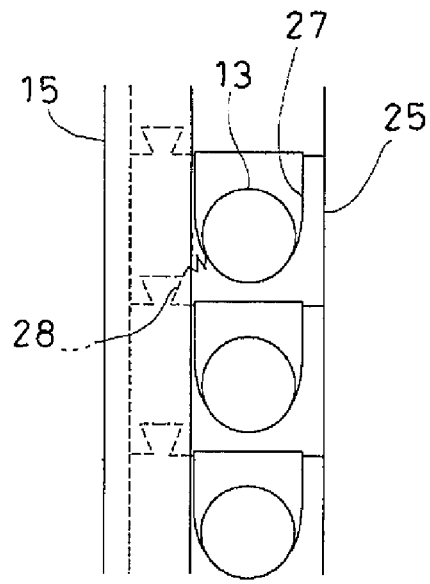
FIG. 13A and FIG. 13B are an enlarged front view and an enlarged lateral view of the principle parts of another conventional support piece being damaged, respectively.
Figure 13B:
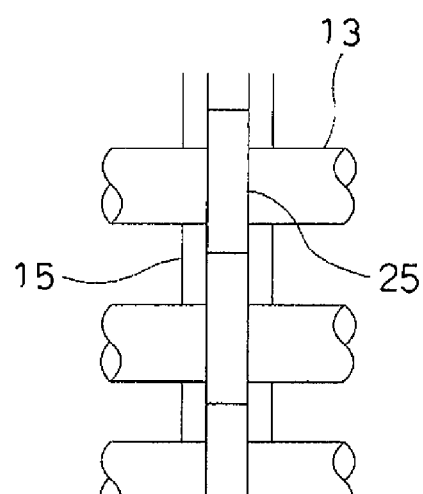
Figure 14:
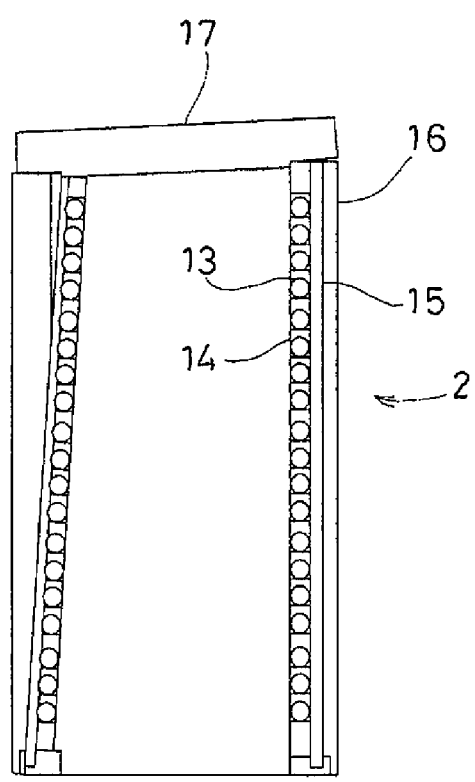
FIG. 14 is a schematic vertical cross-section view showing the separation of a piece holder from a periphery heat insulator and a gap formed between a ceiling heat insulator and the periphery heat insulator in the conventional heater.

Referring to FIG. 6, on a uppermost one of the multiple-connected support pieces 32, a hollow 38a is formed between the upward-facing curved concave surface 33 and a holder support 39 forming a gap 40 between the convex insertions 34 and the holder support 39. Also, as shown in FIG. 7, a hollow 38b is formed by engaging a lower portion of the support piece 32 with a lowermost support piece 41 that has an upward-facing concave curved surface 33 and convex insertions 34.

The heating element 31 is inserted into and supported by the hollow 38, such that in a non-heated and most contracted state, the heating element 31 is placed at the center-facing side of the hollow 38 while a gap is maintained at the outward-facing side of the hollow 38.

Figure 5A:
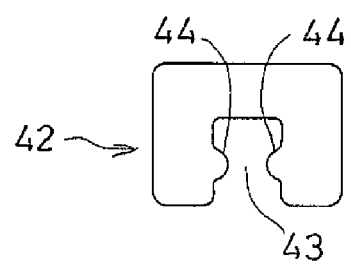
FIG. 5A and FIG. 5B are a plan view and a lateral view of a piece holder in accordance with one embodiment of the present disclosure, respectively.
Figure 5B:
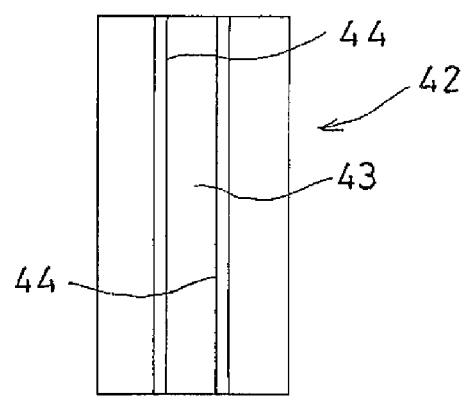

The multiple-connected support pieces 32 are insert-fitted with the piece holders 42 at the outward-facing side of the vertical type furnace. With reference to FIG. 5A and FIG. 5B, the respective piece holders 42 are configured to have a concave portion 43 of a vertically elongated rectangular pillar shape, extending in a vertical direction. As shown in FIG. 5A, the respective piece holders 42 have a substantially U-shaped horizontal cross-section. Further, engagement convexes 44 of a substantially semicircular column extending in a vertical direction, which may be insert-fitted to the engagement concaves 35, are formed on two opposing inner sides of the concave portion 43.

A plurality of the piece holders 42 are vertically connected to each other so that engagement positions thereof are not aligned with those of the multiple-connected support pieces 32. With the above-described configuration, an outward-facing side portion of the support piece 32 may be insert-fitted to (or engaged with) the concave portion 43. Specifically, by engaging the respective support pieces 32 with the concave portions 43 and also engaging the engagement convexes 44 with the engagement concaves 35, relative displacements of the respective support pieces 32 with respect to the respective piece holders 42 may be controlled in the radial and circumferential directions of the vertical type furnace.

Figure 1:
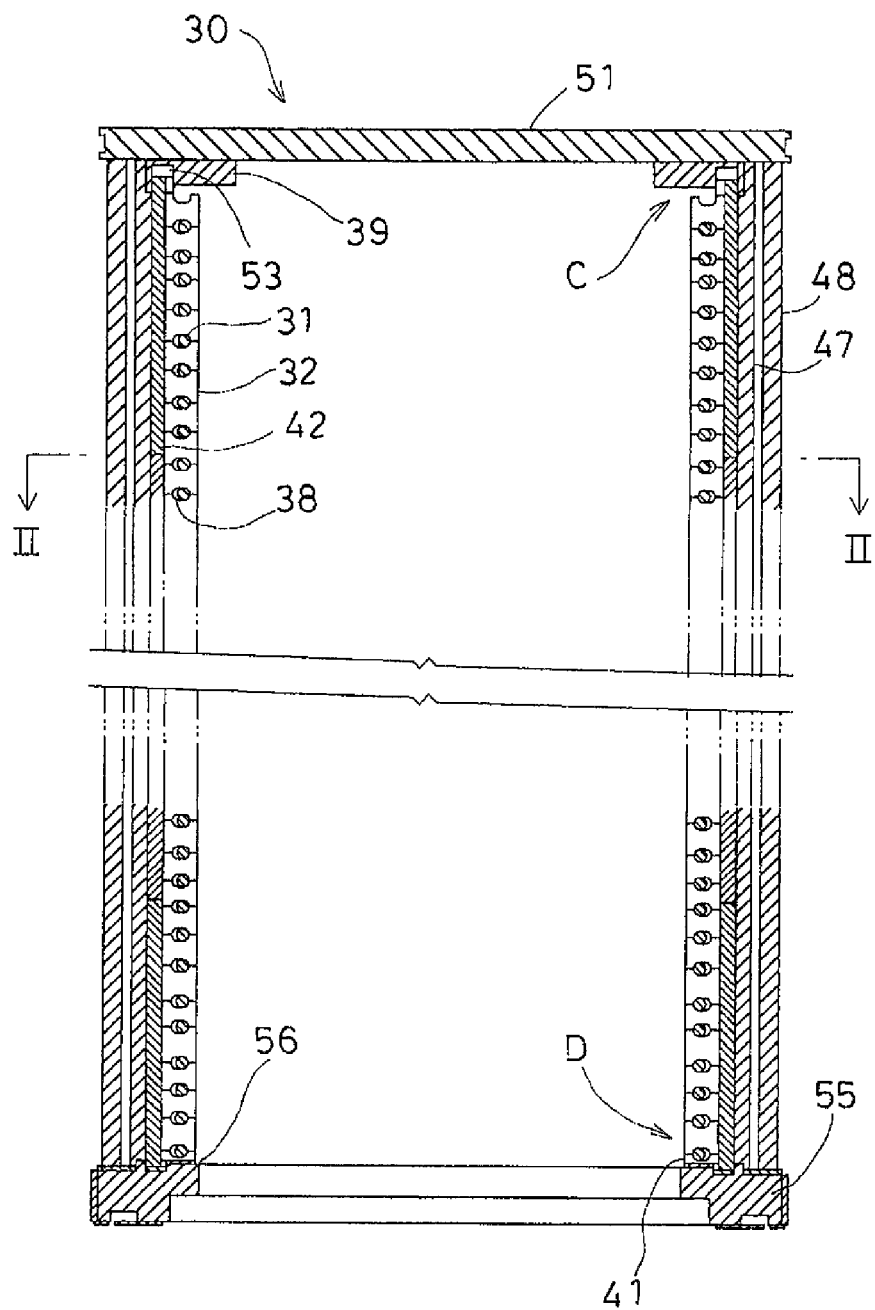
FIG. 1 is a vertical cross-section view of a heater in accordance with one embodiment of the present disclosure.
Figure 2:
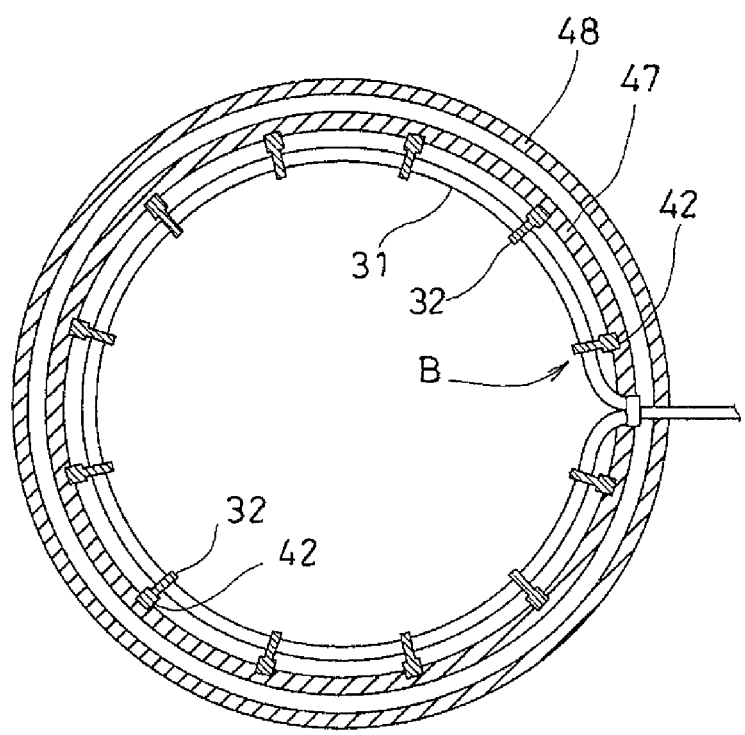
FIG. 2 is a horizontal cross-section view of the heater taken along a line II-II of FIG. 1.
Figure 3:
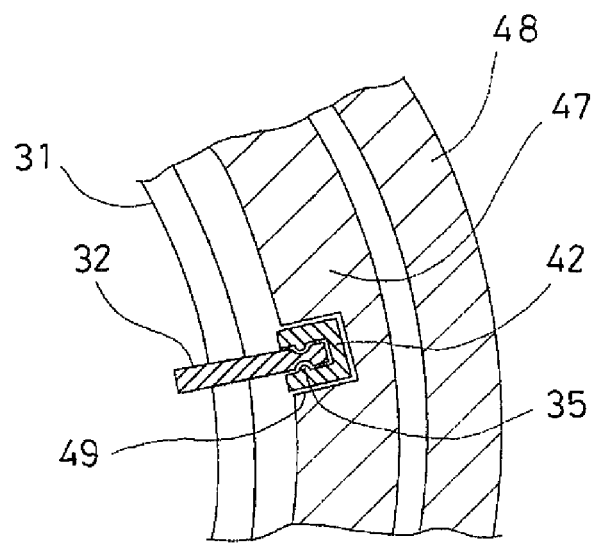
FIG. 3 is an enlarged view of a portion B of FIG. 2.

Referring to FIG. 3, on the surrounding of the piece holders 42, two layers of periphery heat insulators 47 and 48 are formed concentrically with the heating element 31. A groove 49 is vertically engraved at equally spaced positions along the circumference of the periphery heat insulator 47. The grooves 49 support the respective piece holders 42 so that three lateral sides of the piece holders 42, i.e., the outward-facing side and the two circumferential direction sides thereof abut on the grooves 49. The piece holders 42 are vertically connected in multiple, in which an uppermost piece holder 42a is disposed in an uppermost part of the multiple-connected piece holders 42 as shown in FIG. 6 whereas a lowermost piece holder 42b is disposed in a lowermost part thereof as shown in FIG. 7. A height of the multiple-connected piece holders 42 is lower than that of the periphery heat insulator 47. Also, an outer surface of the periphery heat insulator 48 is enclosed with a heater case (not shown).

As shown in FIG. 6, a disk-shaped ceiling heat insulator 51 is horizontally disposed on upper portions of the periphery heat insulators 47 and 48. A holder support 39 is provided to protrude at a predetermined position on a lower surface of the ceiling heat insulator 51. A lower surface of the holder support 39 is positioned lower than that of an upper surface of the uppermost piece holder 42a. Also, a holder support recess 52 is formed in the holder support 39 at a position facing the uppermost piece holder 42a such that the upper portion of the uppermost piece holder 42a is inserted into the holder support recess 52. Alternatively, instead of being formed to protrude at the predetermined position on the lower surface of the ceiling heat insulator 51, the holder support 39 may be formed in a ring shape.

Further, a lower surface of the holder support recess 52 is positioned higher than that of the upper portion of the uppermost piece holder 42a. Thus, a gap 53 is formed between the upper portion of the uppermost piece holder 42a and the lower surface of the holder support recess 52.

Referring to FIG. 7, the multiple-connected piece holders 42 and the periphery heat insulators 47 and 48 are vertically provided to stand on a circular column-shaped heater coil receiver 55 with a heat-insulating sheet 54 interposed therebetween. A protrusion 56 is formed at an inner side of an upper surface of the heater coil receiver 55 to support the lowermost support piece 41 with the heat-insulating sheet 54 interposed therebetween. Further, a protrusion 58 is provided so as to form a holder support recess 57 between an outer circumference of the protrusion 56 and the protrusion 58. The holder support recess 57 and the holder support recess 52 are concentric circles having the same diameter. A lower portion of the lowermost piece holder 42b is inserted into and supported by the holder support recess 57. Also, the heat-insulating sheet 54 is attached to and disposed on an outer circumferential surface and a lower surface of the heater coil receiver 55.

As described above, the upper portion of the uppermost piece holder 42a is inserted into the holder support recess 52 and the lowermost support piece 41 is supported by the protrusion 56. Further, the lowermost piece holder 42b has a protrusion extending downward, which is inserted into the holder support depression 57. In this way, the radial direction movement of the multiple-connected piece holders 42 is controlled by the holder support 39 and the heater coil receiver 55.

While a film forming process is performed on a wafer loaded in the vertical furnace (not shown), the vertical type furnace is heated by the heating element 31, the temperature of which also increases significantly. Thus, the heating element 31 thermally expands to increase its coil diameter, and thus, the entire circumstance thereof expands toward the outward-facing side of the vertical type furnace. Since the hollow 38 has an ellipse shape and includes a gap at the outward-facing side of the vertical type furnace, this gap buffers the force urged against the support pieces 32 even when the heating element 31 expands within the hollow 38. Also, the uppermost and lowermost parts of the multiple-connected piece holders 42 are inserted into and supported by the holder support recess 52 and the holder support recess 57, respectively. At the same time, the side surface of the piece holders 42 directed toward the outward-facing side of the vertical type furnace is supported by the periphery heat insulator 47. With such configuration, the piece holders 42 are controlled not to be displaced toward the outward-facing side of the vertical type furnace.

In addition, due to the heat generated from the heating element 31, the support pieces 32, the piece holders 42, and the periphery heat insulator 47 (with different thermal expansion coefficients) may be thermally expanded at different rates. As a result, the displacements of the upper portions of the support pieces 32, the piece holders 42, and the periphery heat insulator 47 may be different from each other due to the difference in thermal expansion rates. However, since the gap 53 is formed between the upper portion of the uppermost piece holder 42a and the lower surface of the holder support recess 52, this gap buffers the upward thermal expansion of the multi-connected piece holders 42 so that the ceiling heat insulator 51 is not lifted up by such expansion. Also, since the gap 40 is formed between the convex insertions 34 of the uppermost support piece 32 and the holder support 39, the holder support 39 is not lifted up by the thermal expansion of the multiple-connected support pieces 32. Therefore, this prevents a gap from being formed between the ceiling heat insulator 51 and the periphery heat insulator 47 and also avoids deterioration of adiabatic efficiency caused by such gap.

Once the film forming process is completed, the heating element 31 stops emitting heat and the temperature of the heating element 31 decreases. Therefore, the coil diameter of the heating element 31 is decreased, which causes the entire circumference of the heating element 31 to contract toward the center-facing side of the vertical type furnace. In its most contracted state, the heating element 31 is preset to be disposed at the most inner side of each hollow 38, i.e., the portion of the hollow 38 that is most proximate to the center of the vertical type furnace. Thus even when the coil diameter of the heating element 31 is contracted, force is not urged against the center-facing side of the hollow 38. Also, since the upper and lower portions of the multiple-connected piece holders 42 are inserted into and supported by the holder support recess 52 and the holder support recess 57, respectively, the piece holders 42 are controlled not to move toward the center-facing side of the vertical type furnace and thus the piece holders 42 may not be separated from the periphery heat insulator 47.

The convex insertions 34 and the concave insertions 37, which serve as the insert-fitting parts of the support pieces 32, are formed extending between both ends of the support pieces 32 (i.e., extending from the center-facing side of the support pieces 32 to the outward-facing side thereof) in a radial direction with respect to the center of the vertical type furnace. Therefore, even when the heating element 31 thermally expands and contracts as the temperature rises and falls, or when an external force is applied to the multiple-connected support pieces 32 in the radial direction of the vertical type furnace, e.g., due to vibration of the heating element 31 during transportation, the external force may not be concentrated on one of the support pieces 32 and also stress is not concentrated on the insert-fitting parts of one support piece 32. Thus, the external force applied to one support piece 32 is dispersed to adjacent support pieces 32 (e.g., upper and lower support pieces 32. In this way, damage to the support piece 32, which may be caused by the external force applied thereto, can be avoided.

Further, the convex insertions 34 and the concave insertions 37 are formed in a semicircular or substantially circular shape and the upper and lower support pieces 32 are not tightly engaged with each other. Thus, when an external force is applied to one of the support pieces 32 in the circumferential direction of the vertical type furnace, e.g., due to vibration generated during transportation, the support piece 32 may be slightly tilted to disperse stress being concentrated on the convex insertions 34 and the concave insertions 37. As a result, the damage to the support piece 32, which the external force is applied, may be avoided.

In some instances, the tilting of one support piece 32 may not be sufficient to disperse the stress being concentrated on the convex insertions 34 and the concave insertions 37 as the external force applied to the support piece 32 in the circumferential direction becomes greater. In such case, the concave insertions 37 of the support piece 32 may slide along the curved surfaces of convex insertions 34 of the lower support piece 32 that is engaged with the support piece 32, and also the convex insertions 34 of the support piece 32 lifts up, through its curved surfaces, concave insertions 37 of the upper support piece 32 that is engaged with the support piece 32. In this way, the support piece 32 to which the external force is applied is displaced relative to the adjacent support pieces in the circumferential and upward directions, such that the stress being concentrated on the convex insertions 34 and the concave insertions 37 of the support piece 32 may be dispersed in the vertical direction. As a result, the damage to the support piece 32, which the external force is applied, may be avoided.

As described above, when one support piece 32 to which the external force is applied is lifted up by the convex insertions 34 of the lower support piece 32, and again the convex insertions 34 of the support piece 32 pushes up the concave insertions 37 of the upper support piece 32, convex insertions 34 of the uppermost support piece 32 are relatively displaced in the upward direction. However, since the gap 40 buffers the upward displacement of the convex insertions 34 of the uppermost support piece 32, the convex insertions 34 of the uppermost support piece 32 is not urged against the holder support 39, and thus no gap is formed between the ceiling heat insulator 51 and the periphery insulator 47.

By preventing the support pieces 32 from being damaged, production yield is increased and accidents such as a short circuit, an electric leakage, and the like resulting from a contact between the heating element 31 and other members is prevented as well. Therefore, the expected lifespan and reliability of the heater 30 may improve.

In the present embodiment, the convex insertions 34 and the concave insertions 37 are formed on the upper and lower surfaces of the respective support pieces 32, respectively. In alternate embodiments, the concave insertions 37 and the convex insertions 34 may be formed on the upper and lower surfaces of the respective support pieces 32, respectively.

Also, in the present embodiment, the engagement concaves 35 are formed on the respective support pieces 32 whereas the engagement convexes 44 are formed on the respective piece holders 42. Alternatively, in some embodiments, the engagement convexes 44 may be formed on the respective support pieces 32 whereas the engagement concaves 35 may be formed on the respective piece holder 42.

According to the present embodiment, the movement of the multiple-connected piece holders 42 in the radial direction of the vertical type furnace is controlled by inserting the upper portion of the uppermost piece holder 42a into the holder support recess 52 formed on the holder support 39. However, in some embodiments, the movement of the multiple-connected piece holder 42 may be controlled by forming a holder support recess formed on the ceiling heat insulator 51 at a position facing the upper portion of the uppermost piece holder 42a and inserting the upper portion of the uppermost piece holder 42a into the holder support recess. This eliminates the necessity of the holder support 39, thereby reducing a manufacturing cost.

In the present embodiment, the heater 30 is described as being employed in a semiconductor manufacturing apparatus, but it is not limited thereto. In some embodiments, the heater 30 may be employed in any other type of apparatus having a furnace, in addition to the semiconductor manufacturing apparatus.

Other Embodiments

Although some embodiments of the present disclosure have been described in detail above, the present disclosure may not be limited to these embodiments described above and may include the following embodiments.

First Additional Embodiment

According to a first additional embodiment of the present disclosure, there is provided a heater supporting device including: a heating element having a coil shape and being disposed around an object to be heated; support pieces being vertically connected in multiple; and hollows having an elliptical shape elongated in a radial direction and being formed between the support pieces connected to each other, wherein the heating element is inserted into the hollows and supported by the support pieces. A concave insertion is formed, in a direction intersecting with the heating element, on one of upper and lower portions of each of the support pieces and a convex insertion is formed on the other one of the upper and lower portions of the respective support pieces, the convex insertion being insert-fitted to the concave insertion. The support pieces are vertically connected to each other by insert-fitting the convex insertion to the concave insertion.

Second Additional Embodiment

In the heater supporting device according to the first additional embodiment, the support pieces are supported by a plurality of piece holders being vertically provided to control the movement of the support pieces in a horizontal direction. Further, the piece holders are supported by a periphery heat insulator disposed around the heating element.

Third Additional Embodiment

In the heater supporting device according to the first additional embodiment, the concave insertion and the convex insertion are formed in a radial direction with respect to the object to be heated, extending from one end of the upper and lower surfaces of the respective support pieces to the other end thereof.

Fourth Additional Embodiment

The heater supporting device according to the second additional embodiment further includes a ceiling heat insulator disposed on an upper portion of the periphery heat insulator, a holder support including a protrusion formed on a lower surface of the ceiling heat insulator, and a holder support recess formed on the holder support, wherein an uppermost part of the multiple-connected piece holders is inserted into the holder support recess.

Fifth Additional Embodiment

The heater supporting device according to the second additional embodiment further includes a ceiling heat insulator disposed on an upper portion of the periphery heat insulator and a holder support recess formed on the top heat insulator, wherein an uppermost part of the multiple-connected piece holders is inserted into the holder support recess.

Sixth Additional Embodiment

In the heater supporting device according to any one of the fourth and fifth additional embodiments, a gap is formed between the upper end of the multiple-connected piece holders and a lower surface of the holder support recess.

In accordance with the above embodiments, even when the heating element thermally expands or contracts as the temperature thereof rises and falls, an external force is not urged against the support pieces through the hollows. Further, if an external force is applied to one of the multiple-connected support pieces, e.g., due to vibration generated during transport, it is possible to disperse the external force to the upper and lower support pieces adjacent to the support piece to which the external force is applied, without concentrating the external force and stress on the support piece. As a result, damage to the respective support pieces may be avoided.

Also, in accordance with the above embodiments, the support pieces are supported by piece holders, which are vertically connected in multiple, thereby controlling the movement of the support pieces in a horizontal direction. Further, the respective piece holders are supported by a periphery heat insulator that is disposed around the heating element. Therefore, it is possible to prevent damage caused by the relative displacement of the respective support pieces resulting from thermal expansion and contraction of the heating element. Also, a short circuit due to the contact between some portions of the heating element, and an electric leakage due to a contact between the heating element and other components may be avoided.

Further, in accordance with the above embodiments, the respective piece holders having a U-shaped cross-section have a concave portion. A vertically elongated engagement groove is formed on either at least one of the surfaces facing each other in the concave portion or at least one of lateral sides of the respective support pieces. An engagement convex is formed on the other surface facing the surface on which the engagement groove is formed, so that the engagement convex is insert-fitted to the engagement groove. In this manner, the respective support pieces are insert-fitted to the respective piece holders, and also the engagement convex is insert-fitted with the engagement groove. Therefore, it is possible to prevent damage caused by the relative displacement of the respective support pieces and respective piece holders. Also, this eliminates maintenance work required for reassembling the heater.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications which would fall within the scope and spirit of the inventions.

What is claimed is:

1. A heater supporting device comprising:
a heating element having a coil shape and being disposed around an object to be heated; and
support pieces being vertically connected in multiple,
wherein hollows are formed between the respective support pieces and each hollow has a slot shape having a major axis in a radial direction and forming radiused edges,
the heating element is inserted into the hollows and supported by the respective support pieces, wherein in a most contracted state, the heating element is placed at a center-facing side of the hollows while a gap is maintained at an outward-facing side of the hollows,
a concave insertion, extending in the radial direction intersecting with the heating element, is located on one of an upper surface and a lower surface of each of the support pieces from one end to another end of the one of the upper surface and the lower surface and a convex insertion, extending in the radial direction intersecting with the heating element, is located on the other of the upper surface and the lower surface of each of the support pieces from one end to another end of the other of the upper surface and the lower surface, the upper surface and the lower surface extending to a center-facing side and extending to an outward-facing side in the radial direction with the hollows disposed between the center-facing side and the outward-facing side, the convex insertion of one of the support pieces being insert-fitted with the concave insertion of another one of the support pieces adjacent to the one of the support pieces,
the support pieces are vertically connected in multiple by insert-fitting the concave insertions to the convex insertions, and
the hollows surrounding the heating element so that the convex insertion and concave insertion of each support piece extend from the center-facing side to the outward-facing side of the surrounded heating element, and the center-facing side and the outer facing side being at opposite sides of the surrounded heating element.

2. The device of claim 1, further comprising piece holders being vertically connected in multiple to support the support pieces and a periphery heat insulator disposed around the heating element to support the piece holders, wherein the piece holders control the movement of the support pieces in a horizontal direction.

3. The device of claim 2, wherein the respective piece holders have a U-shaped concave portion, a vertically elongated engagement groove and an engagement convex are formed on at least one of inner surfaces of the concave portion, the inner surfaces facing each other and at least one of lateral sides of the respective support pieces, such that the engagement groove faces the engagement convex, and the support pieces are insert-fitted to the piece holders by insert-fitting the engagement convex to the engagement groove.

4. A heater supporting device comprising:
a first support piece including a first upper surface and a first lower surface,
the first upper surface comprising a first upper surface insertion and a first upward facing concave surface, and
the first lower surface comprising a first lower surface insertion and a first downward facing concave surface;
a second support piece located on top of the first support piece, the second support piece including a second upper surface and a second lower surface,
the second lower surface comprising a second lower surface insertion that engages the first upper surface insertion and a second downward facing concave surface aligned with the first upward facing concave surface to define a hollow, the hollow having a slot shape having a major axis in a radial direction and forming radiused edges;
the second upper surface comprising a second upper surface insertion and a second upward facing concave surface; and
a heating element located in the hollow, the heating element having a coil shape and being disposed around an object to be heated, wherein in a most contracted state, the heating element is placed at a center-facing side of the hollow while a gap is maintained at an outward-facing side of the hollow,
wherein the first upper surface insertion of the first support piece is formed, in the radial direction that intersects with the heating element, from one end to another end of the first upper surface, the first upper surface extending to a center-facing side and to an outward-facing side in the radial direction with the first upward facing concave surface disposed between the center-facing side and the outward-facing side, and
wherein the second lower surface insertion of the second support piece is formed, in the radial direction that intersects with the heating element, from one end to another end of the second lower surface, the second lower surface extending to a center-facing side and to an outward-facing side in the radial direction with the second downward facing concave surface disposed between the center-facing side and the outward-facing side, and
the hollow surrounding the heating element so that the first upper surface insertion of the first support piece and the second lower surface insertion of the second support piece extend from the center-facing side to the outward-facing side of the surrounded heating element, and the center-facing side and the outer facing side being at opposite sides of the surrounded heating element.

5. The device of claim 4 wherein the first upper surface insertion is convex and the second lower surface insertion is concave.

6. The device of claim 4 wherein the first upper surface insertion is concave and the second lower surface is convex.

7. The device of claim 4, further comprising a piece holder connected to the first support piece and a periphery heat insulator disposed around the heating element to support the piece holder, wherein the piece holder controls the movement of the first support piece in a horizontal direction.

8. The device of claim 7, wherein the piece holder has a U-shaped concave portion forming a vertically elongated engagement groove and an engagement convex portion located on at least one inner surface of the concave portion such that the support pieces are connected to the piece holders by the engagement groove and engagement convex portions.

9. A heater comprising the heater supporting device of claim 1.

10. A semiconductor manufacturing apparatus comprising the heater of claim 9.

11. A support piece for forming a heating element supporting unit by being vertically connected in multiple to form a hollow, the hollow having a slot shape having a major axis in a radial direction and forming radiused edges, the heating element supporting unit supporting a heating element having a coil shape, the support piece comprising:
a first concave insertion or a first convex insertion formed on one of an upper surface and a lower surface of the support piece, from one end to another end of the one of the upper surface and the lower surface, in the radial direction intersecting with the heating element, the one of the upper surface and the lower surface extending to a center-facing side and to an outward-facing side in the radial direction with the hollow disposed between the center-facing side and the outward-facing side; and
a second convex insertion or a second concave insertion formed on the other of the upper surface and the lower surface that is configured to engage a concave insertion or a convex insertion of another support piece, from one end to another end of the other of the upper surface and the lower surface, in the radial direction intersecting with the heating element, the other of the upper surface and the lower surface extending to a center-facing side and to an outward-facing side in the radial direction with the hollow disposed between the center-facing side and the outward-facing side,
wherein in a most contracted state, the heating element is placed at a center-facing side of the hollow while a gap is maintained at an outward-facing side of the hollow, and
the hollow surrounding the heating element so that the first convex insertion and the second concave insertion of the support piece or the first concave insertion and the second convex insertion of the support piece extend from the center-facing side to the outward-facing side of the surrounded heating element, and the center-facing side and the outer facing side being at opposite sides of the surrounded heating element.

12. The device of claim 1, wherein the concave insertion has a curved surface of a semicircular or substantially semicircular column shape, and
wherein the convex insertion has a curved surface of a semicircular or substantially semicircular column shape.

13. The device of claim 2, wherein a height of the piece holders connected in multiple is configured to be lower than a height of the periphery heat insulator.

14. The device of claim 2, further comprising a ceiling heat insulator including a holder support configured to support the piece holders, the ceiling heat insulator being disposed on an upper portion of the periphery heat insulator.

15. The device of claim 14, wherein a lower surface of the holder support is positioned lower than an upper portion of the piece holders.

\* \* \* \* \*